United States Patent [19]
Wheelwright et al.

[11] Patent Number: 4,858,159
[45] Date of Patent: Aug. 15, 1989

[54] FREQUENCY-TUNEABLE FILTER CALIBRATION

[75] Inventors: Lynn M. Wheelwright, Santa Rosa; Vicky A. Hansen, Rohnert Park; Mark D. Heerema, Santa Rosa, all of Calif.

[73] Assignee: Hewlett-Packard Company, Palo Alto, Calif.

[21] Appl. No.: 111,843

[22] Filed: Oct. 19, 1987

[51] Int. Cl.$^4$ .................. G01C 25/00; G01R 23/00; H03J 3/08; H03J 3/00
[52] U.S. Cl. .................. 364/571.01; 364/485; 364/481; 324/81; 324/80; 324/77 B; 334/4; 334/17; 455/256
[58] Field of Search .................. 364/571.08, 571.01, 364/485, 481, 480; 333/188, 187, 186, 23, 17 R; 334/26, 18, 17, 4; 455/256, 226, 197, 196; 324/81, 80, 77 B, 77 C, 77 CS

[56] References Cited

U.S. PATENT DOCUMENTS

| | | | |
|---|---|---|---|
| Re. 31,943 | 7/1983 | Ready | 455/226 |
| 3,434,057 | 3/1969 | Jackman et al. | 455/197 |
| 3,597,699 | 8/1971 | Seipel | 333/187 |
| 3,641,515 | 2/1972 | Sues | 324/77 C |
| 3,783,409 | 1/1974 | Polson, Jr. | 333/17 |
| 3,973,204 | 8/1976 | Keiter | 455/197 |
| 4,127,819 | 11/1978 | Keane | 334/16 |
| 4,149,122 | 4/1979 | Parato | 455/226 |
| 4,257,018 | 3/1981 | Masdea et al. | 333/17 |
| 4,346,480 | 4/1982 | Poston et al. | 455/154 |
| 4,384,365 | 5/1983 | Malinowski et al. | 455/183 |
| 4,414,638 | 11/1983 | Talambrias | 364/571 |
| 4,435,346 | 3/1969 | Allen et al. | 455/197 |
| 4,607,215 | 8/1986 | Takano et al. | 324/77 B |
| 4,611,164 | 9/1986 | Mitsuyoshi et al. | 324/77 B |
| 4,703,433 | 10/1987 | Sharritt | 364/485 |
| 4,760,535 | 7/1988 | Englmeier | 364/480 |

FOREIGN PATENT DOCUMENTS

0008612  1/1987  Japan .................. 334/17

OTHER PUBLICATIONS

"New Approach to Provide a Crystal Accuracy Frequency Scale to Microwave Sweepers", by Jose L. Herrero, Singer Instrumentation, vol. 2, No. 2, Aug. 1970.

Primary Examiner—Parshotam S. Lall
Assistant Examiner—S. A. Melnick
Attorney, Agent, or Firm—William C. Milks, III

[57] ABSTRACT

An apparatus and method for calibrating a yttrium-iron-garnet-tuned filter (YTF) is disclosed. Instead of using both tune+span information from the 1st LO, only the sweep ramp used to span the 1st·LO is used for the YTF's s own swept spans, and the YTF has its own tune information created independently of tune of the YIG oscillator. This allows calibration at any time, both in the factory or in the field.

11 Claims, 18 Drawing Sheets

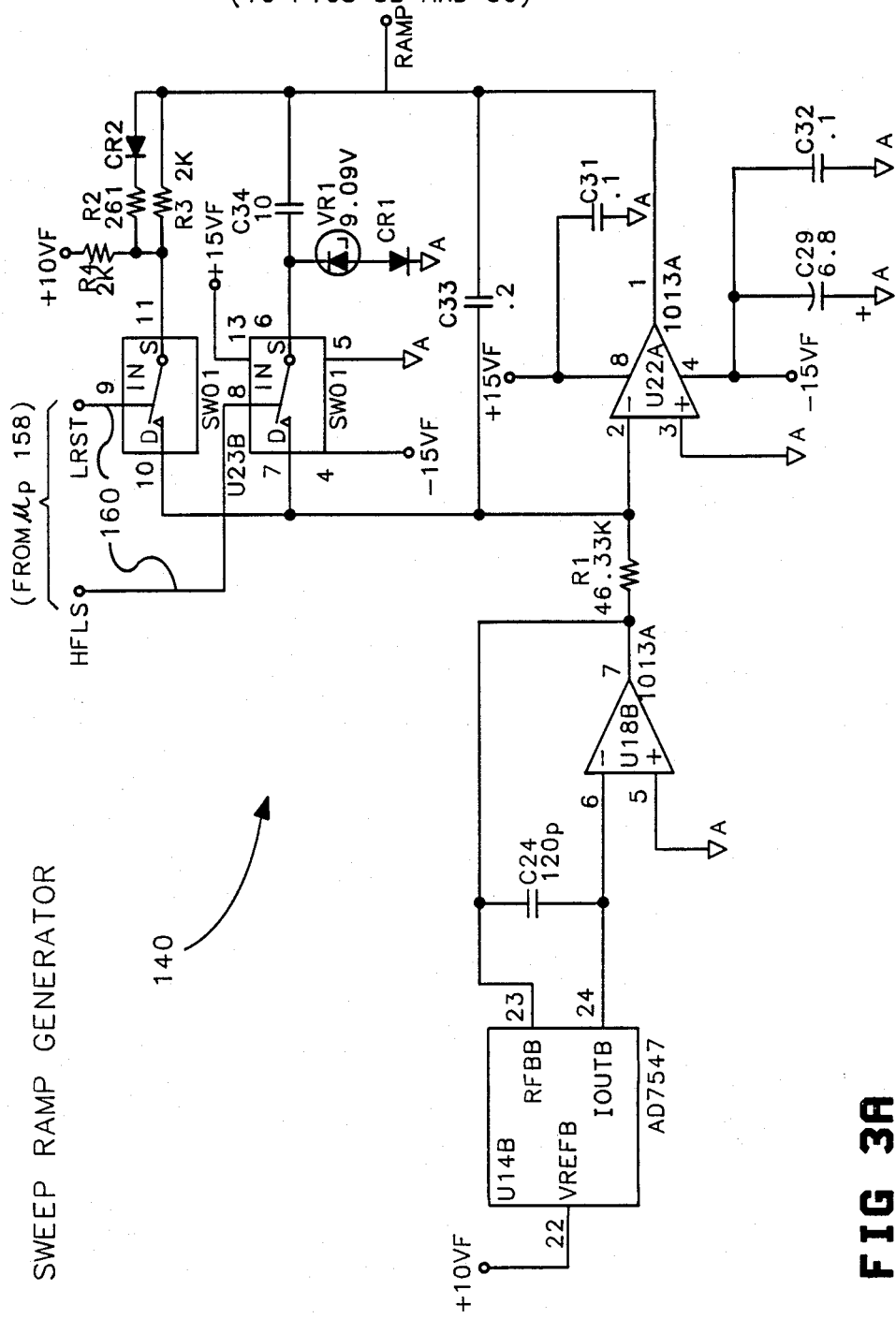

FREQUENCY-TUNEABLE FILTER CALIBRATION

BACKGROUND OF THE INVENTION

This invention relates to high-frequency electrical test instruments and, more particularly, to measuring instrumentation operable over a wide range of frequencies of interest. Specifically, the invention is directed to calibration of frequency-tuneable circuits used in broadband measuring instruments and provides, in one embodiment, a spectrum analyzer with built-in preselector calibration.

Variable tuning circuits, such as yttrium-iron-garnet (YIG) tuning elements, are commonly used in electronically tuneable band pass filters employed in microwave devices. In broadband microwave measuring instruments, such as receivers or spectrum analyzers, these tuneable band pass filters are often used in, or before, radio frequency (RF) input circuits as tuneable preselectors. Consequently, only a narrow band of frequencies is supplied to the instrument input at any one time. This preselection is particularly useful in a broadband heterodyne instrument, since preselection eliminates confusing spurious intermediate frequency (IF) signals due to the mixing of the local oscillator signal with input signals other than a signal having the frequency or frequencies of interest. Also, these tuneable band pass filters are used in sources or broadband swept frequency signal generators to provide a narrow band output signal.

To guarantee frequency and amplitude integrity in a receiver or spectrum analyzer, for example, both a first local oscillator (1st LO) and the YIG-tuned filter (YTF) need to track properly. The 1st LO is driven such that its frequency, or harmonic of its frequency, is a fixed IF offset apart from the input frequency of interest. The YTF is driven so that it tracks the input frequency when the spectrum analyzer is tuned to frequencies covering a given frequency range, for example, 2.7 GHz and above. Because there is a fixed relationship between the positioning of the 1st LO and the YTF center frequencies, previous analyzers offering preselection have typically used tune + span information driving a YIG oscillator in the 1st LO as a source of information for tuning the YIG-tuned filter.

More particularly, a typical known circuit used to drive a YTF is shown in FIG. 1. A driver accepts the same tune + span signal as fed to the 1st LO, and processes it to include the IF offset, which can be either a positive or negative fixed frequency. The driver keeps track of which harmonic of the 1st LO is being used (whose multiplying effect is used to situate the YTF properly).

This known circuit allows a single tune + span signal for the 1st LO to provide information to drive the YTF as well. The price paid here is hardware in the driver to multiply tune + span for the given harmonic, and then extra hardware to accommodate the YTF's own sensitivity to the range allowed by the driver. This matching up is achieved either by an array of resistive potentiometers or digital-to-analog converters (DACS) to match gain and offsets on a per band basis to the given sensitivity of the YTF. This procedure is performed in a point-to-point calibration procedure at the factory and requires extensive manual interaction during the calibration process. In any event, however, the calibration is only approximate in that the calibration is typically determined by the peak response of the YTF over the given frequency range, which may not coincide with the center of the band due to the asymmetric frequency response characteristic of the YIG-tuned filter.

SUMMARY OF THE INVENTION

The present invention provides apparatus and a method for more accurate calibration of a YTF. Instead of using both tune + span information as fed to the 1st LO, only a sweep ramp used to span the 1st LO is used for the YTF's swept spans, and the YTF has its own tune information, created independently of the tune signal driving the YIG oscillator in the 1st LO. Preferably, a 100 MHz comb generator, which offers frequency harmonics past the upper frequency range of the YTF, for example, 22 GHz, is used as the RF reference signal input to the YTF during calibration. Calibration of the YTF is preferably based on the 6 dB points with the center frequency being equidistant between the frequencies at which the 6 dB points occur. This alleviates skew due to the asymmetric frequency response characteristic of the YTF and results in more accurate calibration. Advantageously, the apparatus and method of calibration in accordance with the invention allow calibration at any time, both at the factory and in the field.

BRIEF DESCRIPTION OF THE DRAWINGS

The above and other features and the concomitant advantages of the calibration system of the present invention will be better understood and appreciated by those skilled in the art in view of the description of the preferred embodiments given below in connection with the accompanying drawings. In the drawings:

FIG. 3, comprising FIGS. 3A–3H, is a schematic circuit drawing of a specific implementation of the YTF calibration circuit shown in FIG. 2;

FIG. 4, comprising

FIG. 6, comprising

FIG. 7, comprising FIG. 8, comprising

DETAILED DESCRIPTION OF THE PREFERRED EMBODIMENTS

Figure 1:
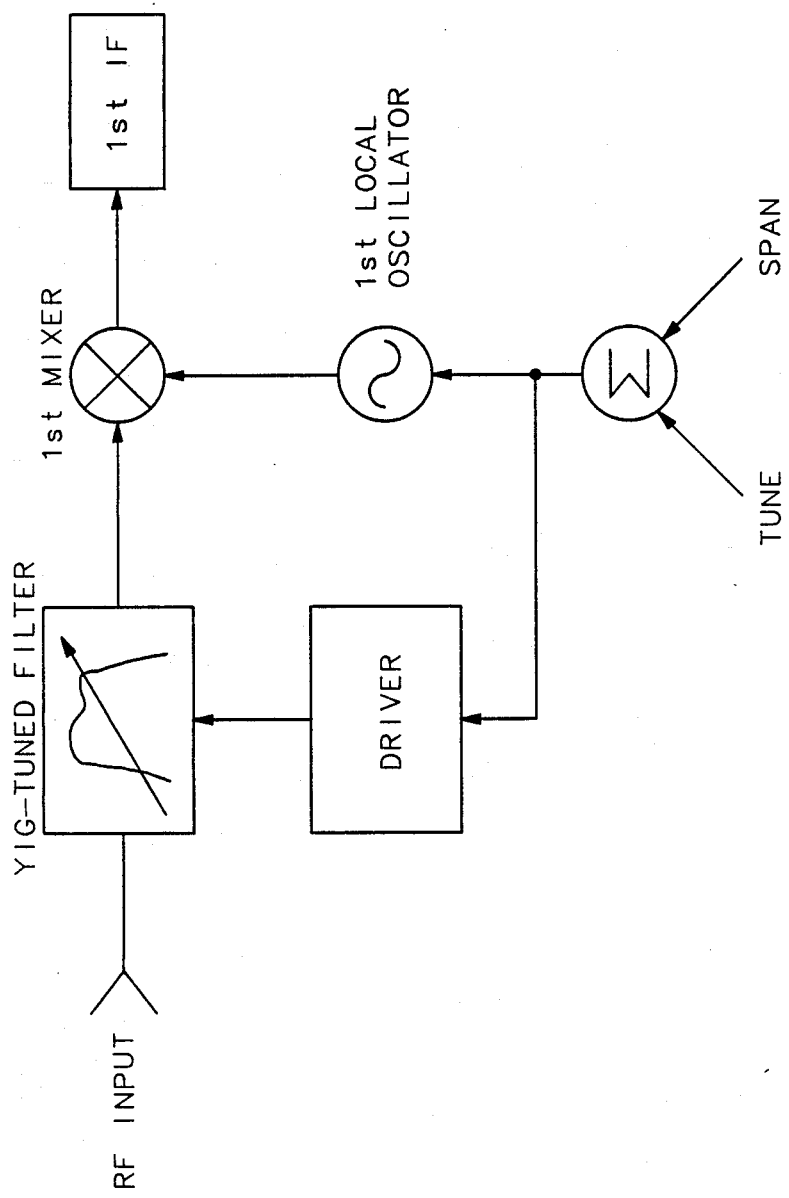
FIG. 1 is a block diagram of a known YTF calibration circuit.
Figure 2:
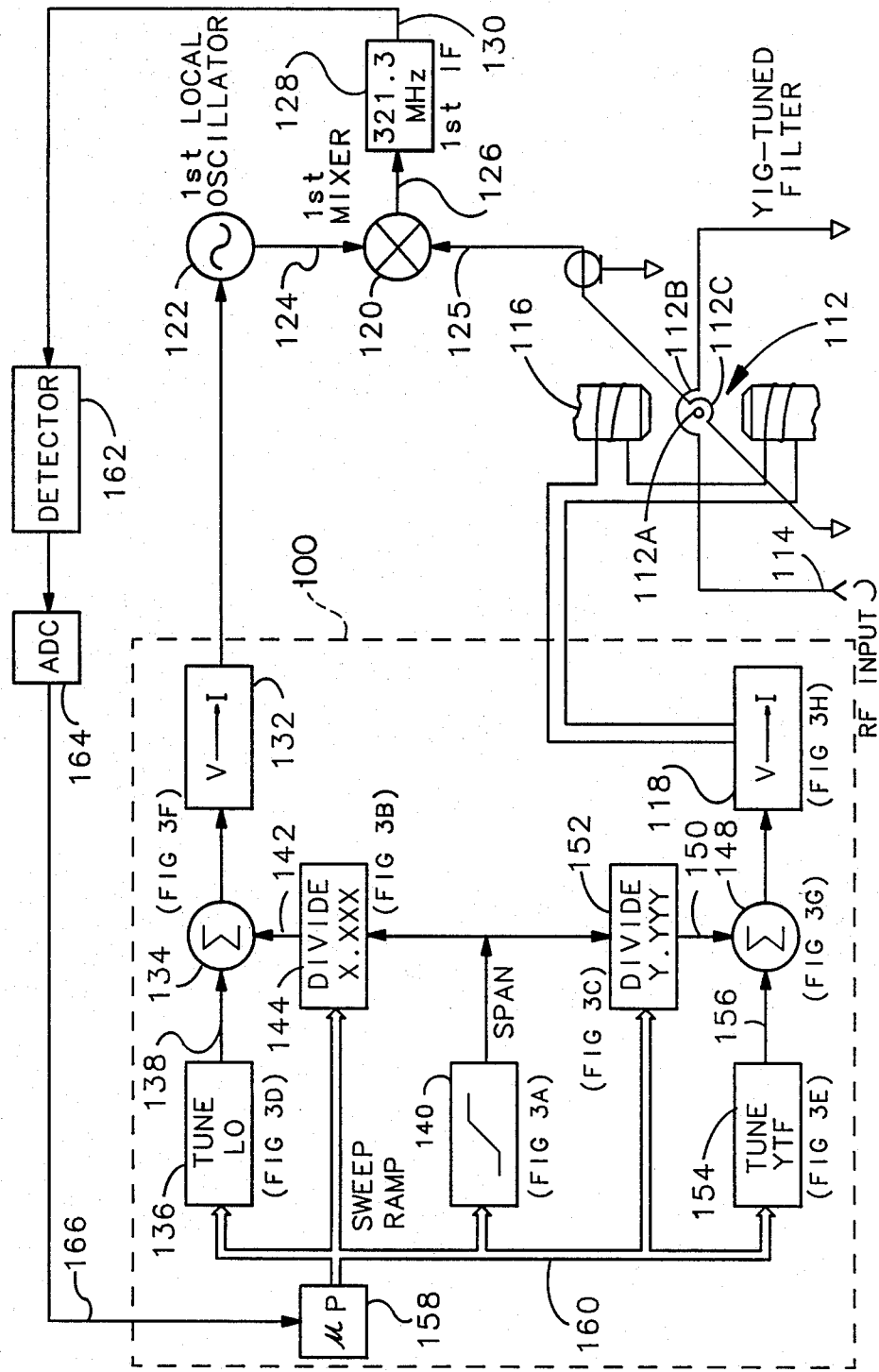
FIG. 2 is a block diagram of an embodiment of the YTF calibration circuit in accordance with the present invention.
Figure 3B:
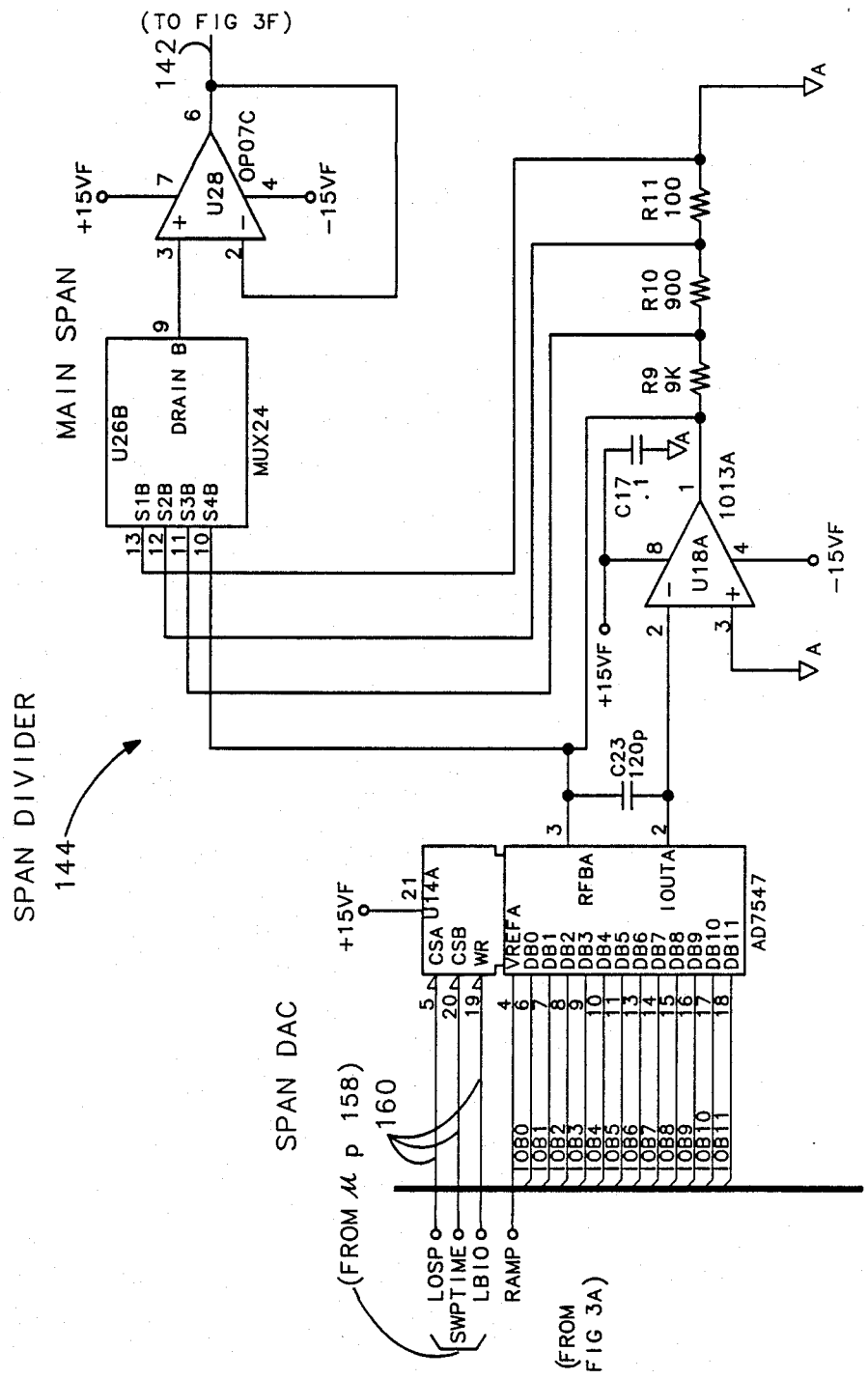
Figure 3C:
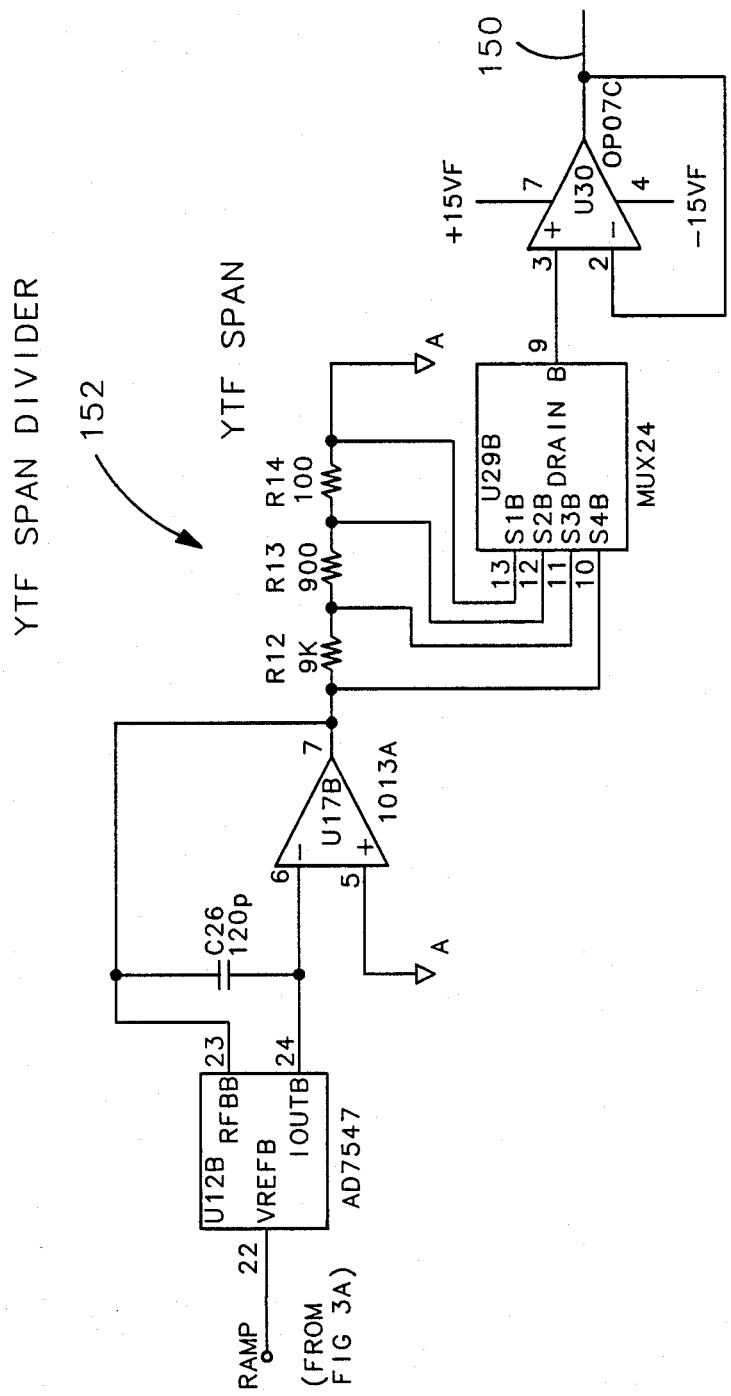
Figure 3D:
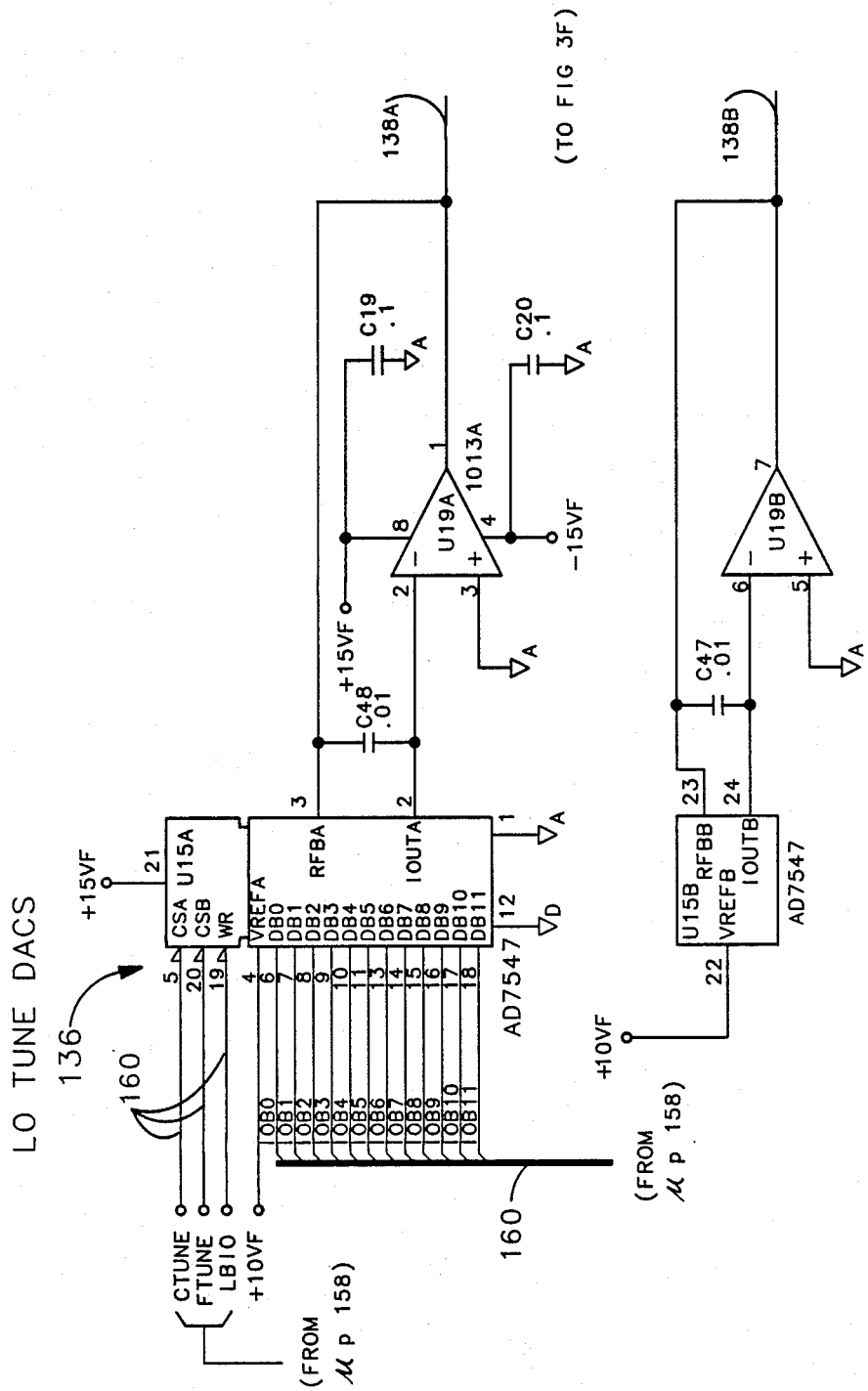
Figure 3E:
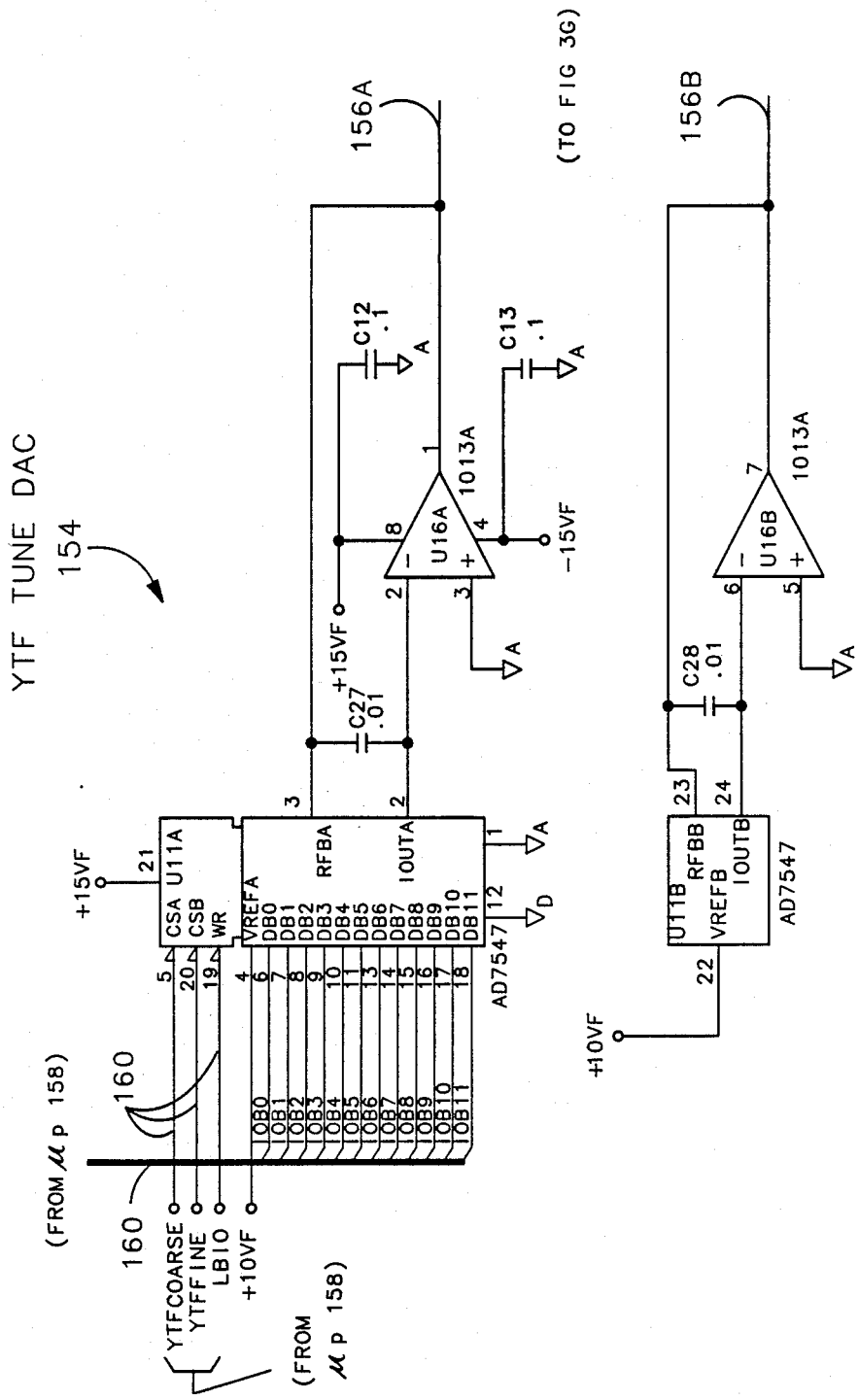
Figure 3F:
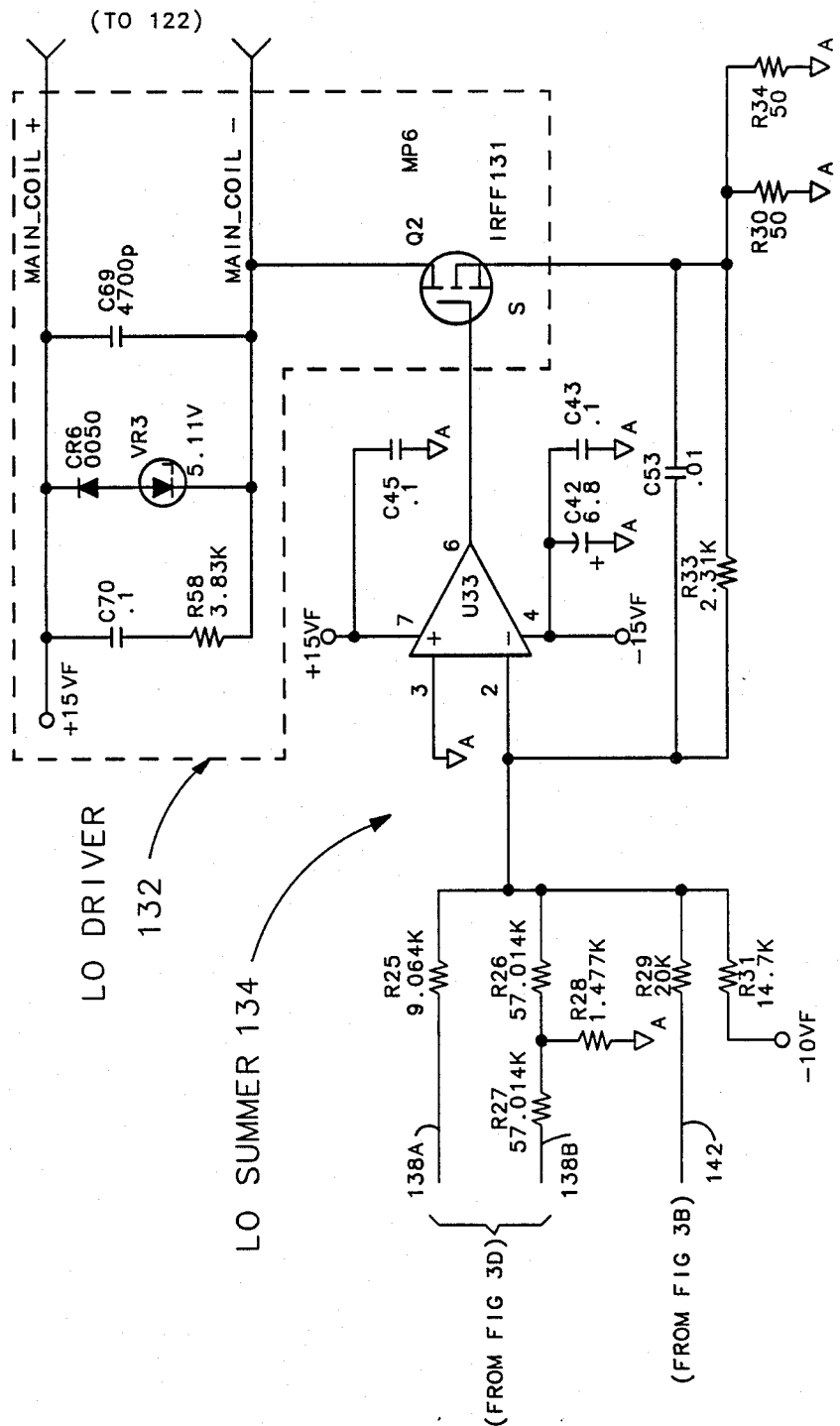
Figure 3G:
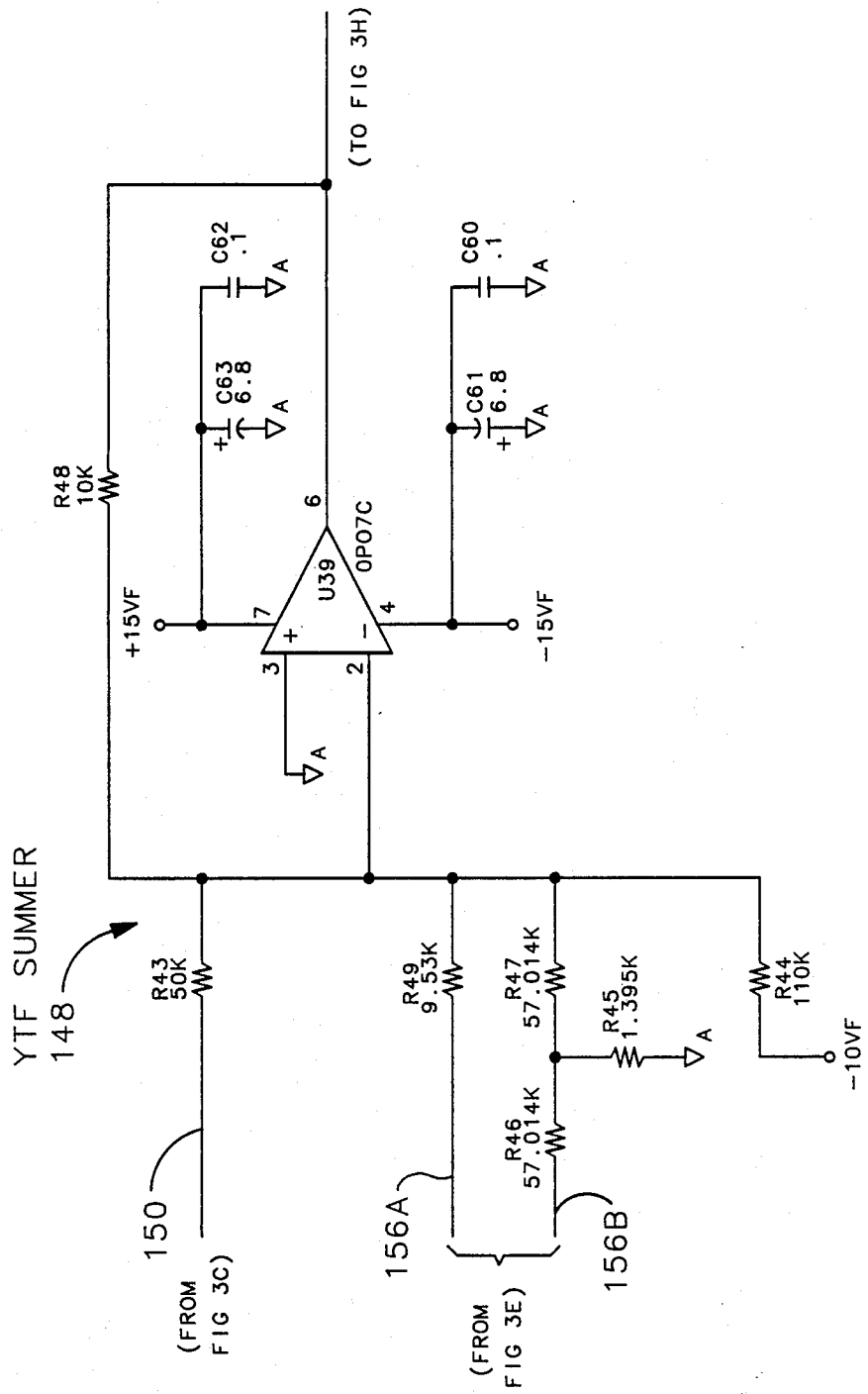
Figure 3H:
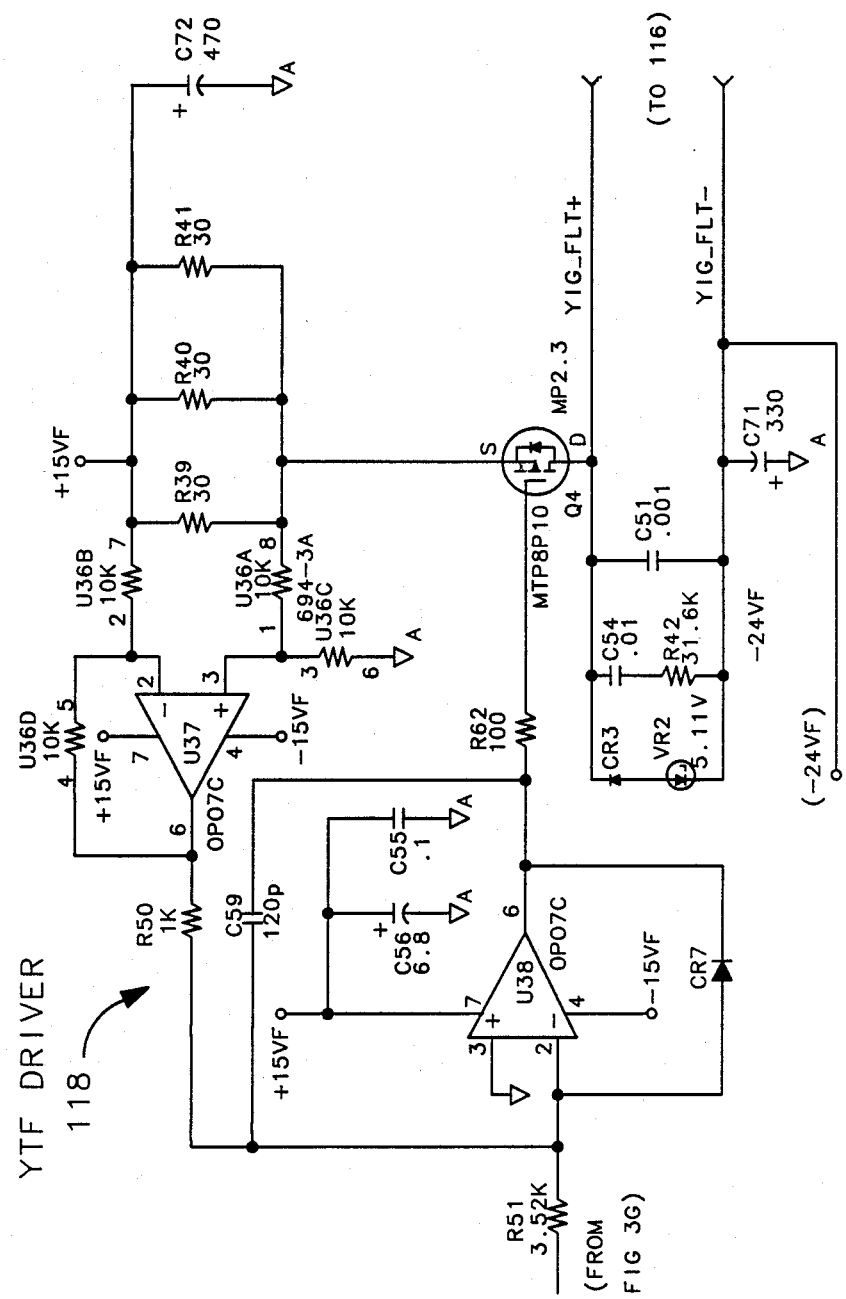

FIG. 2 shows a schematic diagram of one embodiment of a YTF preselector circuit connected to a calibration circuit in accordance with the present invention, generally indicated by the numeral 100. A YIG-tuned filter 112 has a signal input 114. YIG-tuned filter 112 comprises a YIG sphere 112A, an input coupling loop 112B, an output coupling loop 112C, and an electromagnet 116.

The center frequency of the pass band of YIG-tuned filter 112 is determined by a magnetic field produced by electromagnet 116. Tuning current for YIG-tuned filter 112 is supplied to a magnet coil of electromagnet 116 by a YIG-tuned filter driver 118. The structure and operation of YIG-tuned filters are described in further detail in an article entitled "A High-Performance 2- to 18-GHz Sweeper" by Paul R. Hernday and Carl J. Enlow in the *Hewlett-Packard Journal,* Mar. 1975, pages 1–14.

The preselector circuit connects to a mixer 120. Local oscillator power is supplied to mixer 120 by a first local oscillator 122 through an LO input 124. In mixer 120, the input signal, which has been coupled through YIG-tuned filter 112 to mixer 120 by means of a connection 125, mixes with the local oscillator signal, producing various mixing products. The local oscillator signal does not pass through YIG-tuned filter 112 to signal input 114, since the YIG-tuned filter is tuned to a frequency different from that of first local oscillator 122.

The mixing products, or signals, resulting from the combination of the input signal and the local oscillator signal appear at a signal output 126. These signals are fed to a band pass filter network 128 to produce a first intermediate frequency at an intermediate frequency signal output 130. The intermediate frequency is typically chosen significantly lower than the input and local oscillator signal frequencies, so that signals at the input of the band pass filter network 128, other than the intermediate frequency signal, are likely to be very much higher than the intermediate frequency.

In the exemplary embodiment, mixer 120 is configured for an input signal in the range of 2.7 to 22 GHz, a local oscillator signal in the range of 3.0 to 6.8 GHz, and an intermediate frequency of approximately 321 MHz will be appreciated by those skilled in the art, however, that mixer 120 can be used in other frequency ranges.

IF signl output 130 connects to a detector 162 whose output is connected to an analog-to-digital converter (ADC) 164. ADC 164 has an output 166.

As shown in FIG. 2, in addition to YIG-tuned filter driver 118, calibration circuit 100 comprises a first local oscillator driver 132 connected to first local oscillator 122 for driving a YIG oscillator in the first local oscillator. First local oscillator driver 132 is fed an LO tune + span signal by a summer 134. The LO tune signal is generated by a tune LO circuit 136 and appears at an LO tune input 138 to summer 134. The span signal is preferably a swept signal generated by a sweep ramp generator 140 and appears at a span input 142 to summer 134. Preferably, a voltage divider 144 is interposed between sweep ramp generator 140 and summer 134 for selecting the frequency band of the span signal fed to summer 134.

Rather than tune YIG-tuned filter 112 using the LO tune signal, calibration circuit 100 includes an independent tune signal source. More particularly, as shown in FIG. 2, calibration circuit 100 further comprises YIG-tuned filter driver 118 connected to YIG-tuned filter 112 for driving the YIG-tuned filter. YIG-tuned filter driver 118 is fed a YIG-tuned filter tune + span signal by a summer 148. On the one hand, the span signal is preferably the same swept signal generated by sweep ramp generator 140 and appears at a span input 150 to summer 148. Preferably, a voltage divider 152 is situated between sweep ramp generator 140 and summer 148 for selecting the frequency band of the span signal fed to summer 148. On the other hand, the YIG-tuned filter tune signal is generated by a tune YTF circuit 154 and appears at a YTF tune input 156 to summer 148.

Calibration circuit 100 is preferably controlled by a microprocessor 158 which is connected to output 166 of ADC 164. Microprocessor 158 interfaces with tune LO 136, tune YTF 154, sweep ramp generator 140, and voltage dividers 144 and 152 via a bus 160. This enables automated calibration of YIG-tuned filter 112.

FIG. 3 shows a specific implementation of calibration circuit 100 in accordance with the embodiment of the invention of FIG. 2. Integrated circuit types and component values for the specific implementation appear in FIG. 3. Preferably, as shown in FIGS. 3D and 3E, tune LO 136 and tune YTF 154 each comprise coarse and fine tune circuitry. The specific implementation of calibration circuit 100 shown in FIG. 3 is one of many implementations that will occur to persons skilled in the art in view of the block diagram shown in FIG. 2.

Prior to calibration of YIG-tuned filter 112, first local oscillator 122, as well as any other local oscillator, is calibrated for frequency accuracy using a given signal, for example, a 300 MHz calibrated reference oscillator output. This step is needed so that as the preselector circuit shown in FIG. 2 is tuned to harmonic bands, the measuring instrument is frequency accurate.

At this point in time, microprocessor 158, which controls calibration circuit 100, has no knowledge of where to tune YIG-tuned filter 112. Therefore, the calibration method in accordance with the present invention, illustrated in FIG. 4, is invoked, either from a front panel of the measuring instrument, or remotely.

Figure 4A:
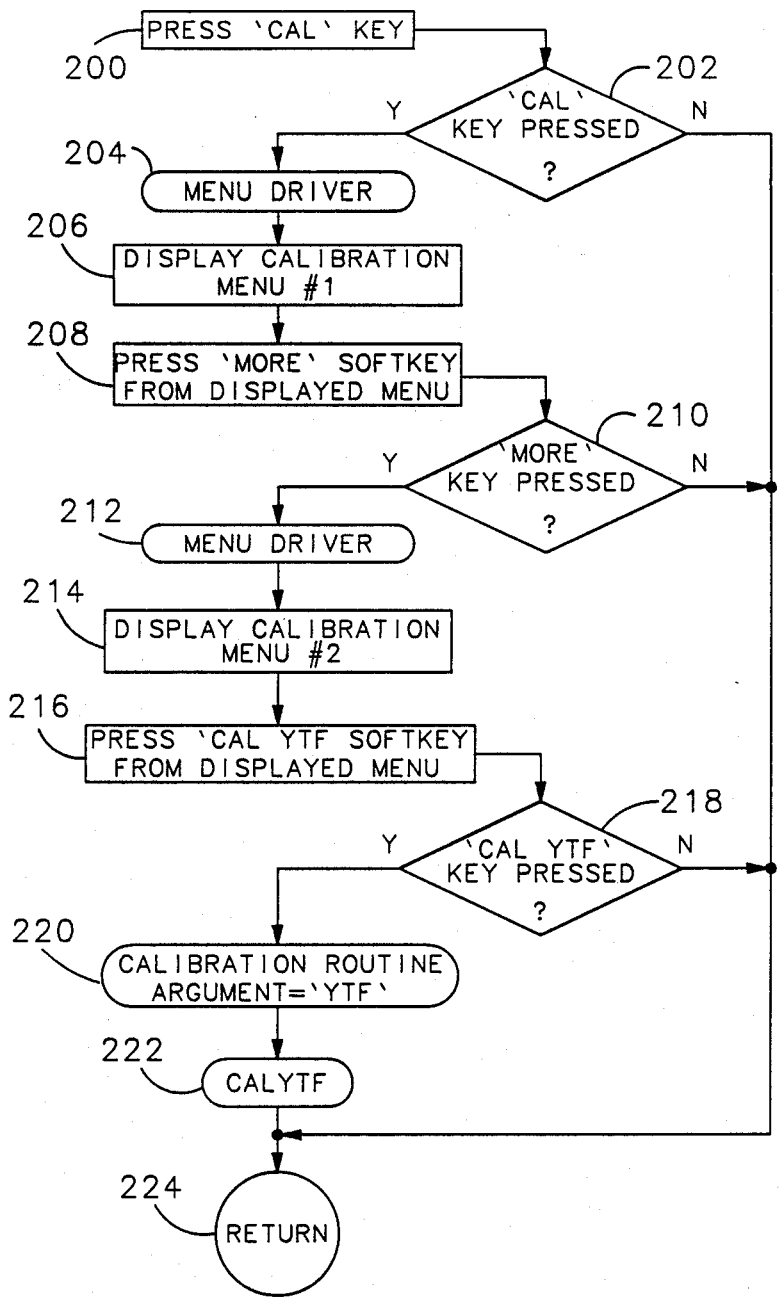
FIGS. 4A–4D, is a flow diagram of one embodiment of the YTF calibration method in accordance with the invention.

For example, the operator can depress a "CAL" key on the front panel of the measuring instrument, as indicated by the numeral 200 shown in FIG. 4A. Microprocessor 158 senses actuation of the "CAL" key, as indicated by the numeral 202, and enables a menu driver, as indicated by the numeral 204. The menu driver then displays a calibration menu, as indicated by the numeral 206.

The selection for the calibration method in accordance with the present invention can be in other than the initial menu which is displayed when the "CAL" key is depressed. Consequently, the operator can depress a "MORE" softkey, as indicated by the numeral 208 shown in FIG. 4A. Actuation of the "MORE" softkey is detected by microprocessor 158, as indicated by the numeral 210, and the menu driver is again enabled, as indicated by the numeral 212.

The menu driver then displays a second calibration menu, as indicated by the numeral 214 shown in FIG. 4A, which can include the calibration method of the invention. The operator depresses a "CALYTF" softkey which appears in the second menu, as indicated by the numeral 216, and microprocessor 158 senses selection of the calibration method of the invention, CALYTF, as indicated by the numeral 218. The CALYTF routine, which will be described in greater detail shortly, is then invoked and executed, as indicated by the numerals 220 and 222. Following calibration of YIG-tuned filter 112, the measuring instrument returns to the main menu, as indicated by the numeral 224.

Generally, in accordance with the calibration method of the invention, an RF signal source, preferably a comb generator, is connected to signal input 114. The first task of the calibration is to characterize the tune curve for YIG-tuned filter 112.

Figure 5:
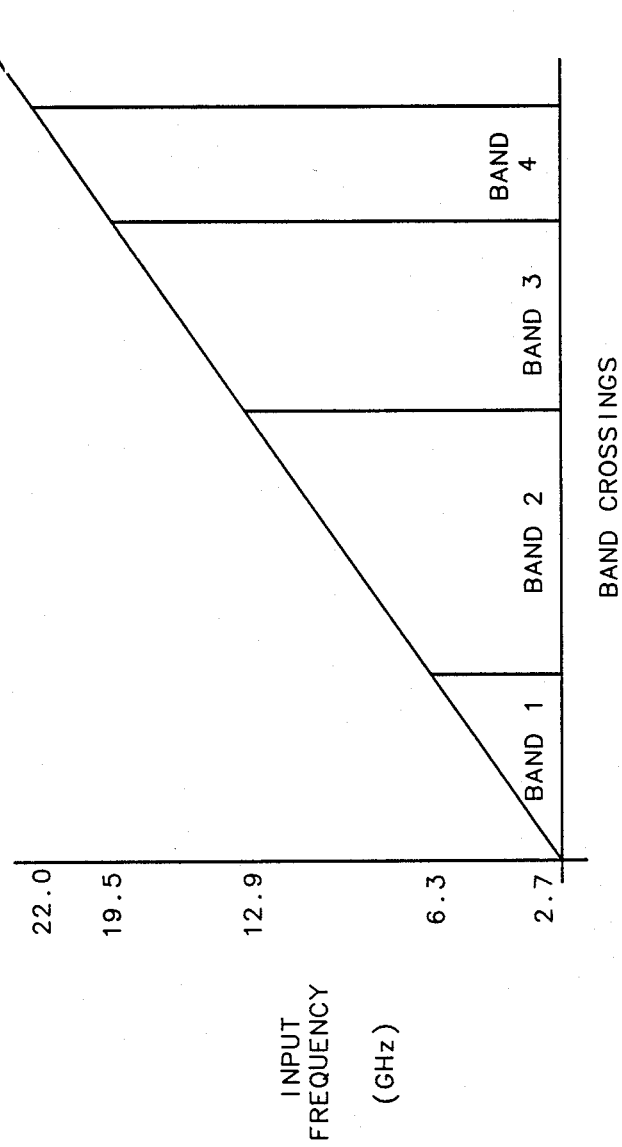
FIG. 5, is a chart which shows exemplary bands over which a YTF can be calibrated.

Preferably, the operating frequency range of YIG-tuned filter 112 is divided into a plurality of frequency bands. A tune curve is then determined for each frequency band. This procedure for determining the tune equation of YIG-tuned filter 112 is performed through all bands. There can be, for example, four bands. In one embodiment, as illustrated in FIG. 5, the frequency points chosen are:

(1) band 1—3.1 and 5.9 GHz
(2) band 2—9.5 GHz
(3) band 3—14.0 GHz
(4) band 4—21.9 GHz By determining where to tune YIG-tuned filter 112 for two fixed points in band 1, the slope and offset describing the current to tune to any particular frequency in the band can be determined. For example, for the first band, two points are chosen, such as 3.1 and 5.9 GHz. Calibration circuit 100 spans predetermined frequency span, such as 60 MHz, at the first calibration frequency (3.1 GHz). Since first local oscillator 122 is calibrated, a comb generator signal at 3.1 GHz is seen if YIG-tuned filter 112 is positioned correctly. Tune YTF 154 is then incrementally stepped to −10 to +10 % around the nominal digital-to-analog (DAC) setting needed to correctly position YIG-tuned filter 112. From the two points taken in band 1, the zero tune offset is calculated and used for calculating the slope and offset for bands 2, 3, and 4.

The preferred method for determining the optimum YIG-tuned filter position is to take the peak for a particular sweep. This maximum is saved as a point in trace B.

Figure 6A:
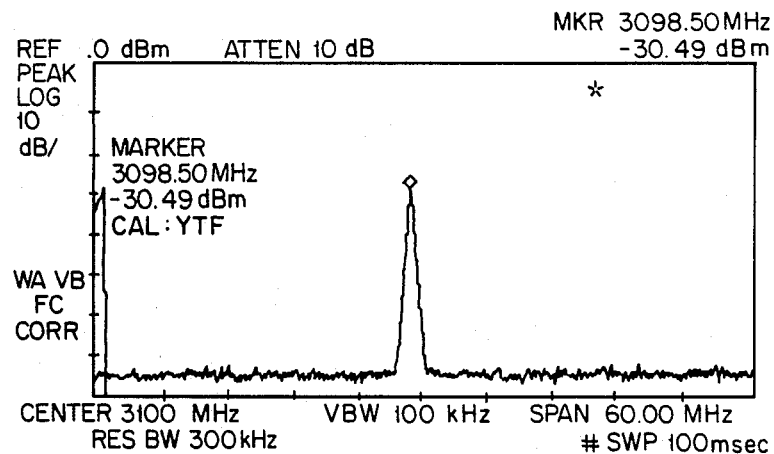
FIGS. 6A–6C, illustrates the frequency response characteristic of a YTF during various steps of the calibration method shown in FIG. 4 for tuning the YTF.
Figure 6B:
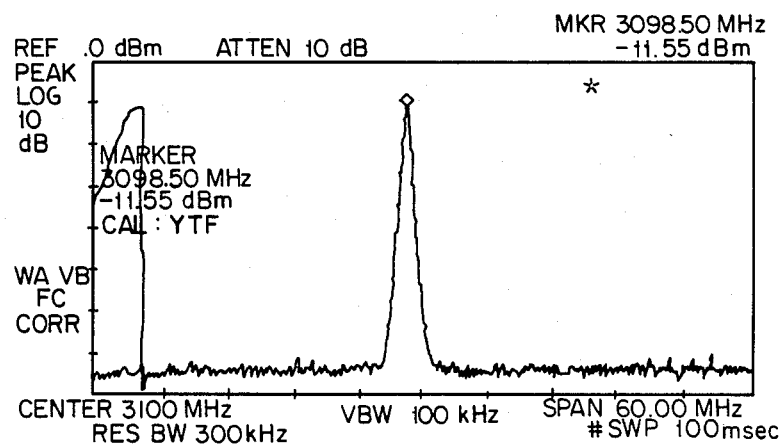

Each of the plots in time, such as FIG. 6A, represents a sequence as YIG-tuned filter 112 progresses from a mistuned to a tuned to a mistuned position. The second plot, FIG. 6B, shows the maximum position. This is what microprocessor 158 needs to know for positioning YIG-tuned filter 112 for the best possible tracking at a single frequency.

Figure 6C:
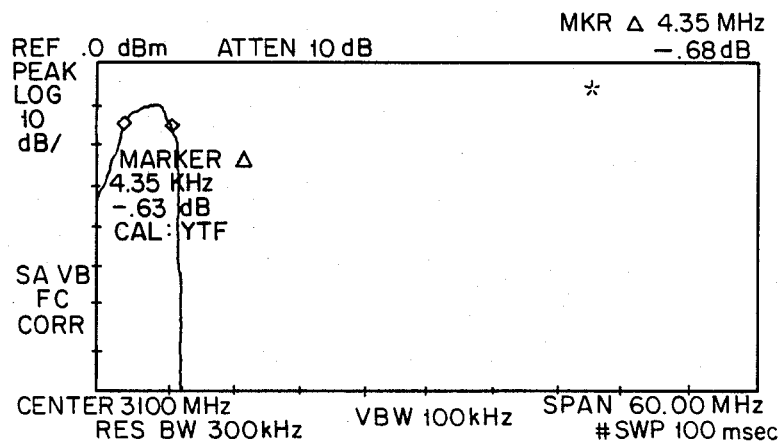
Figure 7A:
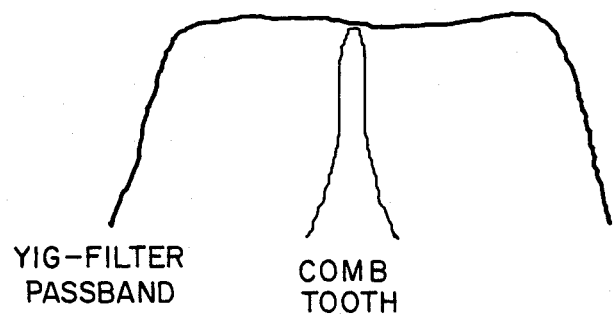
FIGS. 7A and 7B, illustrates the preferred method for calibrating the center frequency of a YTF.
Figure 7B:
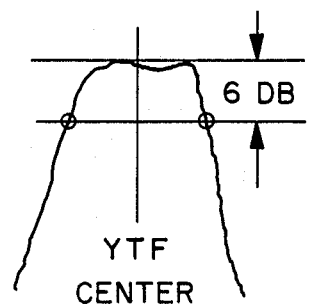

However, because the 3 dB bandwidth of YIG-tuned filter 112 is on the order of 40 MHz, or more, as illustrated in FIG. 7A, using the maximum does not necessarily position YIG-tuned filter 112 at the center of its bandwidth. For this reason, the information in trace B is used to locate the center of the entire peak. Preferably, the center of the 6 dB points is found and used as the calibration point, as shown in FIGS. 6C and 7B.

Figure 8A:
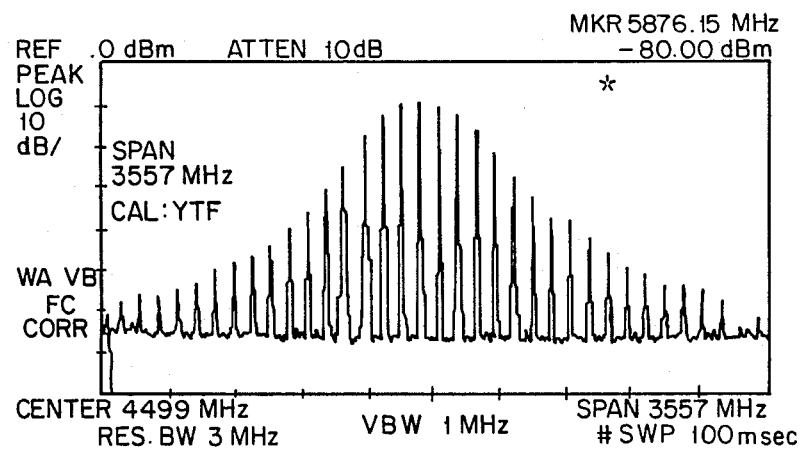
FIGS. 8A–8C, illustrates the frequency response characteristic of a YTF during various steps of the calibration method shown in FIG. 4 for tuning the span of the YTF.
Figure 8B:
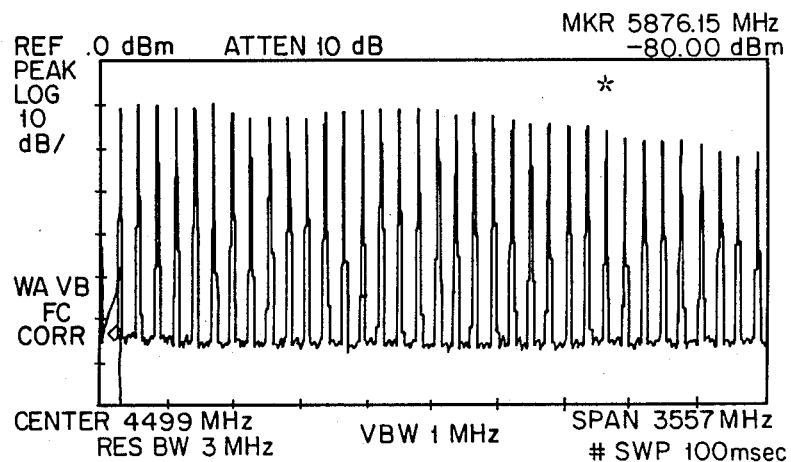
Figure 8C:
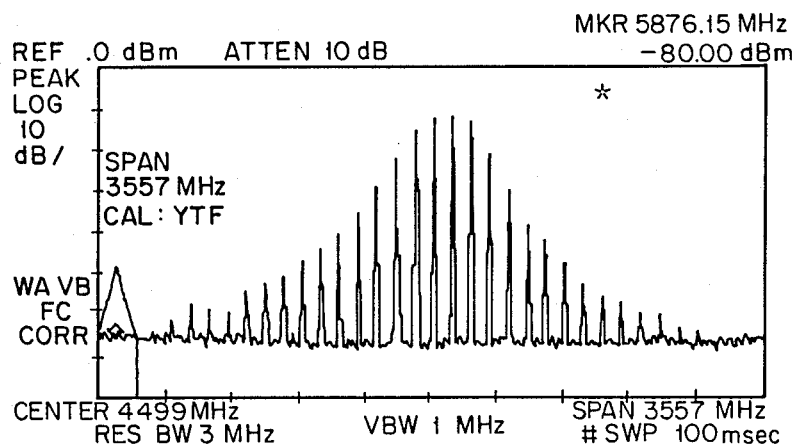

Determining the tune equation for each band is only the first task. The other task is determining the span equation. For this part of the calibration, each band is again taken separately. The span for each band is opened so that a multiple number of comb teeth can be seen. Being in a wide span, the decade span attenuator included in the voltage divider 152 is set to the wide open position. The binary span attenuator included in the voltage divider 152 is use to limit the sweep ramp according to the code that microprocessor 158 writes to the DAC. Then, since the tune equation has been calibrated, the center of screen shows full amplitude of the comb generator teeth as the sweep ramp is varied. As with calibrating the tune equation, the binary span DAC is allowed to vary from a minimum to a maximum, making trackability of the harmonic bands change, as can be seen in FIGS. 8A–8C.

Microprocess or 158 looks at the number of teeth observed, and traps a maximum. Microprocessor 158 then locates the end teeth, and detects a maximum from these two points. This is performed for each harmonic band.

All these YIG-tuned filter frequency calibrations are preferably stored in non-volatile memory and are used by microprocessor 158 to create the sensitivity constants unique to matching the YIG oscillator in first local oscillator 122, YIG-tuned filter 112, and their respective drivers 132 and 118.

Figure 4B:
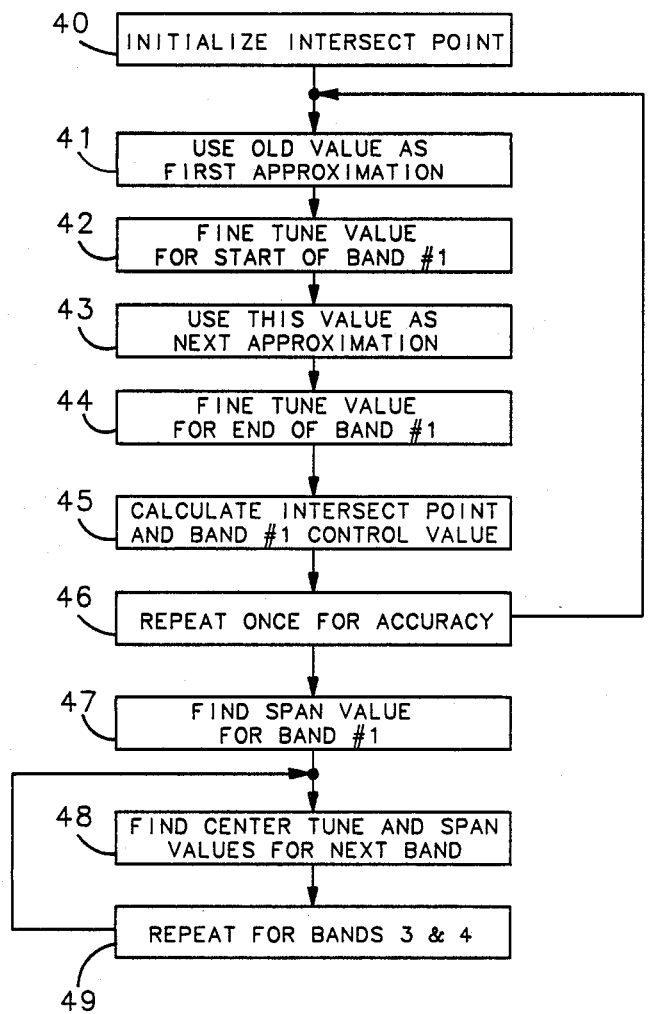
Figure 4C:
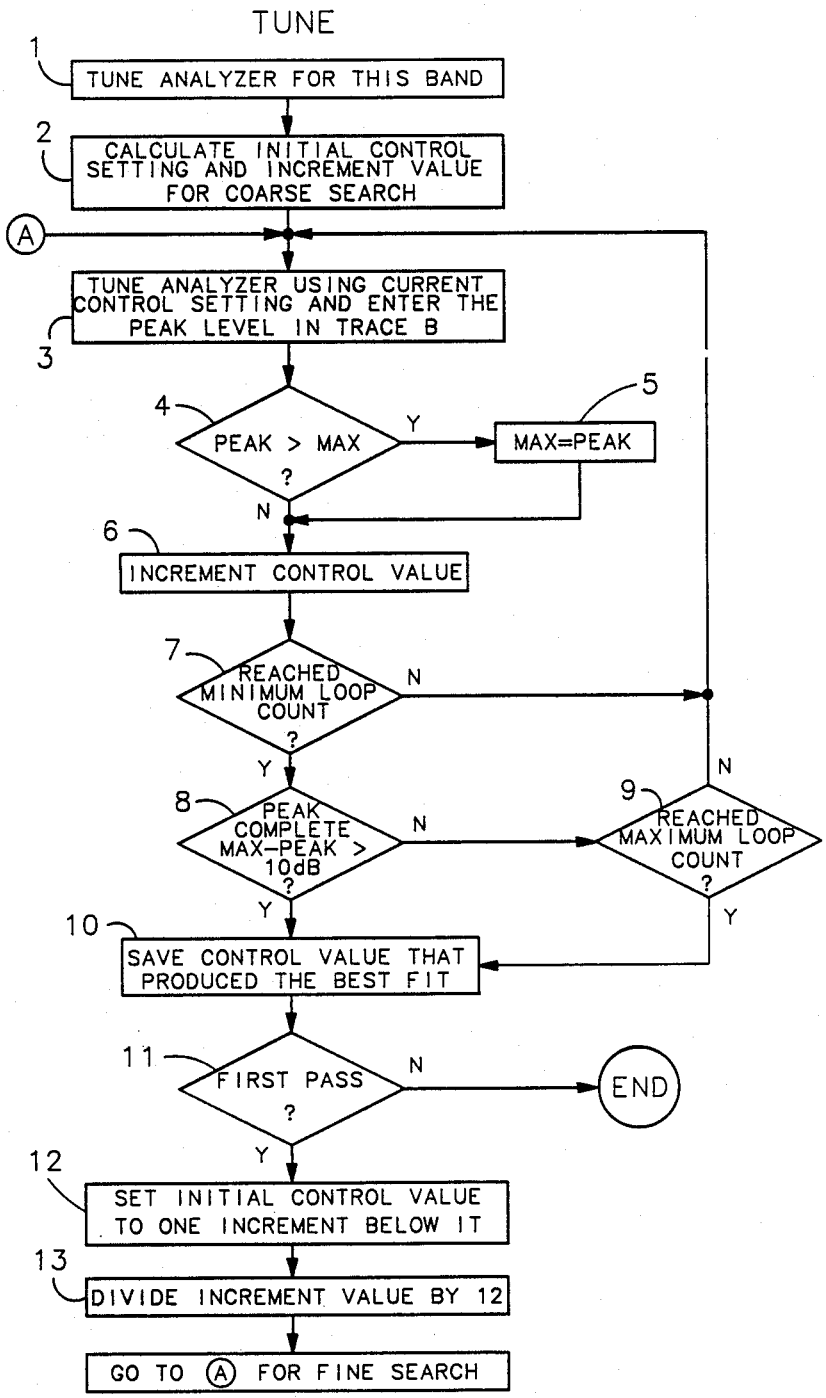
Figure 4D:
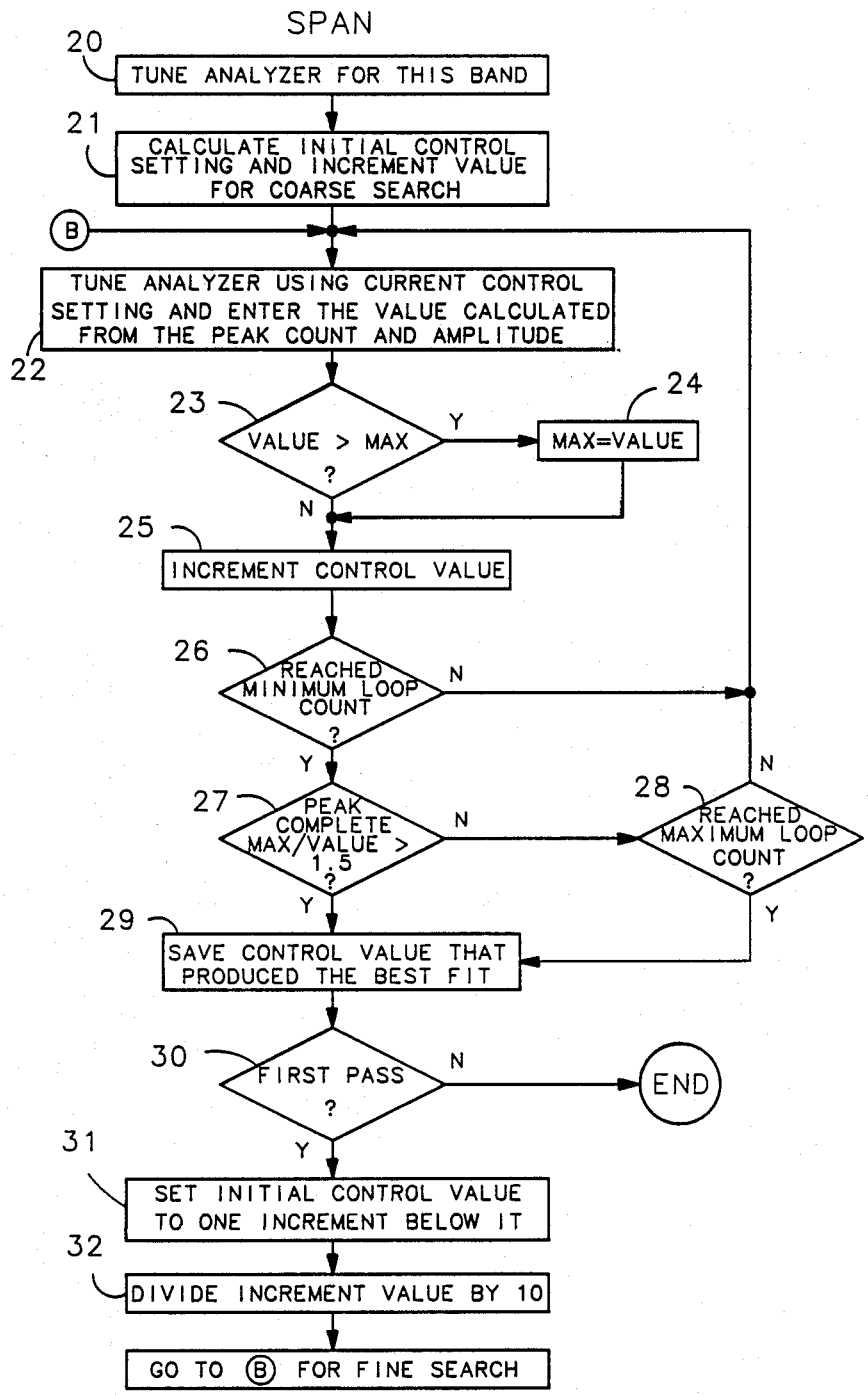

Considered in more detail, FIGS. 4B–4D show the flow diagram of the YIG-tuned filter calibration method of the invention. The following pages contain a copy of the firmware code. The numerals shown in FIGS. 4B–4D are implemented by the correspondingly numbered lines of code which appear on the following pages.

```
PROCEDURE CALYTF; ENTRY;
& calculates correction factors for each band of the YIG &
BEGIN
INTEGER BND, LEN, I, J;
DOUBLE MAX, SM;
REAL MX, SCAL, BASE, CTRL, INC, F0, F1, F2;
REAL TABLE CF.L: = 3.1@9,4.5@9,5.9@9,9.5@9,14.0@9,21.1@9;
& note: 3.1@9 is this language's version of 3100000000 &

SUBROUTINE SEARCH;
    & finds central control value for YTF &
    BEGIN
          ┌ BNDSEL: = BND;
    1     │ DOCOMMAND ("SP60MZ;B1B3");                      & set harmonic no. &
          └ TUNE (CFREQ);

MAX: = 0;                                       & initialize setting to low value &
          ┌ SCAL: = RBNDS[(BND-1)*2];                       & use value from last band &
          │ BASE: = SCAL * REAL(CFREQ − YTFZRO);
    2     │ CTRL: = BASE / REAL(CFREQ − YTFZRO + 3@8);
          └ INC: = SCAL − CTRL;

REPEAT 2 DO BEGIN                               & coarse then fine scan of data &
              INC: = INC/12;
    13
              I: = 0;                                       & loop counter &
```

-continued

```
              ┌  MAX: = 0;                                          & remembered peak value &
              │  ACLEAR(TRCB, TRACELEN);                            & initialize array to zero &
              │  DO BEGIN
              │     ┌  RBNDS[BND*2]: = CTRL;                        & try next control value &
              │     │  TUNE (CFREQ);
              │  3  │  TAKESWP;
              │     │  DOCOMMAND ("M2E1;");                         & find peak value &
    TUNE      │     │  TRCB[I]: = MKRLVL;                           & insert it into array &
              │     └  I: = I + 1;                                  & increment counter &
              │  4  IF MKRLVL > MAX THEN BEGIN
              │     ┌  MAX: = MKRLVL;                               & remember the maximum level found &
              │  5  └  MX: = CTRL;                                  & and the control setting for it &
              │     END; & if-new max &
              │  6  CTRL: = CTRL + INC;                             & set up next control value &

│  7-9 END UNTIL I > 25 AND (MAX - MKRLVL) > 1000 OR I > 300;   & repeat min 25 &
              │     ┌  DOCOMMAND("A4E1");                           & find maximum in array &
              │     │  MKBW(-600);
              │  10 │  J: = ABS(MRKR + AMKR)/2-2;                   & find the center of this peak &
              │     └  MX: = CTRL - (I - J)*INC;                    & calculate the control value for it &
              │  12   CTRL: = MX - INC;                             & position for fine search &
              │       DOCOMMAND("A1M2");
              │       END; & repeat &
              │  11
              │       RBNDS[BND*2]: = MX;                           & set value for this band &
              └       END serch;

┌ SUBROUTINE SWEEP;
              │ & finds span control value for YTF &
              │ BEGIN
              │        ALPHA TABLE SPN.L: = "SP7GZ;","SP4.8GZ;";
              │     ┌  KFLAG: = SBIT(KFLAG,11);                     & lock into harmonic number &
              │  20 └  TUNE (CFREQ);
              │     ┌  SCAL: = RBND[3];
              │     │  CTRL: = .9 * SCAL;
              │  21 │  MAX: = 0;
              │     │  INC: = SCAL - CTRL;
              │     └  IF BNDSEL < 4 THEN J: = 0 ELSE J: = 1;

│     REPEAT 2 DO BEGIN                               & coarse then fine search &
              │        INC: = INC/10;
              │  32
              │        ACLEAR(TRCB,TRACELEN);                       & initialize array to zeros &
              │        I: = 0;
              │        DO BEGIN
              │     ┌  RBNDS[BND*2 + 1]: = CTRL;
              │     │  DOCOMMAND (SPN[J]);                          & set up req'd span for this band &
    SPAN      │     │  TAKESWP;                                     & use it to find data &
              │  22 │
              │     │  & find aggregate of end peaks only &
              │     │  LEN: = PEAKS ("TRD", "TRA", "FRQ");
              │     │  SM: = (TRCA[TRCD[0] - 1] + TRCA[TRCD[LEN - 1] - 1]) + DOUBLE(LEN*LEN)*10;
              │     │  TRCB[I]: = SM/8;                             & put this value in the array &
              │     └  I: = I + 1;

│  23 IF SM > MAX THEN BEGIN
              │     ┌  MX: = CTRL;                                  & remember the maximum value &
              │  24 └  MAX: = SM;                                   & and the control setting for it &
              └     END; & if-new max &
```

```
                                    -continued
25      CTRL: = CTRL + INC;
        MRKR: = PKSRCH(TRCB,I);                              & set marker to maximum in array &
26-28   END UNTIL I > 25 AND ((10*MAX)/SM) > 15 OR I > 40;   & repeat min 25 &
31      CTRL: = MX − 2*INC;                                  & set for fine search &
30      END;
        RBNDS[BND*2 + 1]: = MX;                              & set value for this band &
        END sweep;
        & BEGIN calytf &
40      YTFZRO: = YTFZROI;                                   & initialize &
        BNDOFST: = 0;
        REPEAT 2 DO BEGIN
        DOCOMMAND ("IP;COMB ON;SP60MZ;ST.1;");               & set up machine state &
        CALMSG ("YTF");                                      & user message &
        & band 1 - first endpoint &
41      RBNDS[0]: = RBND[2];                                 & use old value as approximation &
42      BND: = 1; CFREQ: = CF[0]; SERCH;
        & band 1 - second endpoint &
43      RBNDS[0]: = RBNDS[2];                                & save 1st - temp value only - not band 0 &
44      BND: = 1; CFREQ: = CF[2]; SERCH;

⎡ F0: = CF[0] − YTFZRO;
        ⎢ F1: = CF[2] − YTFZRO;
        ⎢ F2: = RBNDS[2]*F1 − RBNDS[0]*F0;
45      ⎢ YTFZRO: = YTFZRO − F1*F0*(RBNDS[0] − RBNDS[2])/F2;  & intersect pt &
        ⎢ RBNDS[2]: = F2/(CF[2] − CF[0]);
        ⎣ RBNDS[0]: = 0;                                     & clear off temporary value &
46      END;
47      CFREQ: = CF[1]; SWEEP;                               & calculate best slope &
        & other bands &
        ⎡ DOCOMMAND("CT;");                                  & automatic sweep times &
48      ⎣ BND: = 2; CFREQ: = CF[3]; SERCH; SWEEP;

⎡ DOCOMMAND ("AT0;RB1MZ;VB0-1;RL-20;");              & zero attenuation for 3 + 4 &
        ⎣ BND: = 3; CFREQ: = CF[4]; SERCH; SWEEP;
49      DOCOMMAND ("RB300KZ;");                              & improve signal for last band &
        BND: = 4; CFREQ: = CF[5]; SERCH; SWEEP;
        CALDONE;                                             & user message &
        END calytf;
```

Initially, when the CALYTF routine is called, as indicated by the step 220 shown in FIG. 4A, the intersect point is initialized at a predetermined nominal value based on the specifications for YIG-tuned filter 112 and driver 118, as indicated by the numeral 40 shown in FIG. 4B. Microprocessor 158 uses the value just initialized as the YIG-tuned filter calibration value for a first approximation, as indicated by the numeral 41. Then, microprocessor 158 finds the tune value for a frequency near the beginning of band 1, as indicated by the numeral 42.

The calibrated tune value is determined as shown in FIG. 4C. Microprocessor 158 initiates tuning YIG-tuned filter 112 for the given band, as indicated by the numeral 1. First, microprocessor 158 calculates an initial control setting and an inorement value to conduct a coarse search, as indicated by the numeral 2. YIG-tuned filter 112 is tuned using this current control setting, and the peak level is entered in trace B, as indicated by the numeral 3. The current peak level is then checked to determine whether or not the previously detected high, or maximum, value is exceeded, as indicated by the numeral 4. If the maximum is exceeded, as indicated by the step 4, the maximum is set equal to the peak level, as indicated by the numeral 5.

The control value is then incremented, as indicated by the numeral 6. On the one hand, if the minimum loop count has not been reached, as indicated by the numeral 7, microprocessor 158 returns to step 3 to continue the search for the maximum value. On the other hand, if the minimum loop count is reached, as indicated by step 7, microprocessor 158 checks to determine if the maximum minus the current peak level exceeds 10 dB in order to ascertain whether or not the search for the maximum value has been found, as indicated by the numeral 8. If so, the control value that produced the best fit is saved, as indicated by the numeral 10.

If not, microprocessor 158 then determines whether or not the maximum loop count has been reached, as indicated by the numeral 9. If not, microprocessor 158 returns to step 3 to continue the coarse search for the maximum peak level; if so, the control value that produced the best fit is saved, as indicated by step 10.

Microprocessor 158 then checks whether or not both the coarse and fine tune have been completed, as indicated by the numeral 11. If so, the tune subroutine for the given band is complete; if not, the initial control value is set to one increment below the present value, as indicated by the numeral 12, this increment is divided by a predetermined value, for example, 12, as indicated by the numeral 13, and microprocessor 158 proceeds to step 3 for the purpose of fine tuning YIG-tuned filter 112.

The value determined for YIG-tuned filter tuning at the beginning frequency in band 1 is used as the approximation for tuning YIG-tuned filter 112 at the concluding frequency in the first band, as indicated by the numeral 43 shown in FIG. 4B. The tune value for YIG-tuned filter 112 is then determined for a frequency near the end of band 1, as indicated by the numeral 44, analogously to determining the tuning value for the frequency near the beginning of the first band, in accordance with steps 1-13 shown in FIG. 4C. Then the intersect point, or, zero frequency Offset, is calculated, as well as the control value for band 1, as indicated by the numeral 45 shown in FIG. 4B. Preferably, the tuning procedure described above is then repeated once for accuracy, as indicated by the numeral 46.

Next, as indicated by the numeral 47 shown in FIG. 4B, microprocessor 158 finds the span value for band 1. The span value is determined as shown in FIG. 4D.

Microprocessor 158 initially tunes YIG-tuned filter 112 for band 1, as indicated by the numeral 20. The tuning of YIG-tuned filter 112 is based on the data stored during tuning of the YIG-tuned filter for the first band, as determined by steps 1-13 shown in FIG. 4C. Microprocessor 158 calculates an initial control setting of YIG-tuned filter 112 for span and a value for incrementing this setting in readiness for conducting a coarse search, as indicated by the numeral 21 shown in FIG. 4D. The span of YIG-tuned filter 112 is then determined using the current control setting to tune the YIG-tuned filter, and the value calculated from the peak count and amplitude using this current control setting is entered, as indicated by the numeral 22. The current peak value is then checked to determine whether or not the previously detected high, or maximum, value is exceeded, as indicated by the numeral 23. If the maximum is exceeded, as indicated by step 23, the maximum is set equal to the peak value, as indicated by the numeral 24.

The control value is then incremented, as indicated by the numeral 25. On the one hand, if the minimum loop count has not been reached, as indicated by the numeral 26, microprocessor 158 returns to step 22 to continue the search for the maximum value based on the peak count and amplitude. On the other hand, if the minimum loop count is reached, as indicated by step 26, microprocessor 158 checks to determine if the maximum value divided by the current peak value exceeds 1.5 in order to ascertain whether or not the search for the maximum value has been found, as indicated by the numeral 27. If so, the control value that produced the best fit is saved, as indicated by the numeral 29.

If not, microprocessor 158 then determines whether or not the maximum loop count has been reached, as indicated by the numeral 28. If not, microprocessor 158 returns to step 22 to continue the coarse search for the maximum peak value; if so, the control value that produced the best fit is saved, as indicated by step 29.

Microprocessor 158 then checks whether or not both the coarse and fine tune have been completed, as indicated by the numeral 30. If so, the span subroutine for the given band is complete; if not, the initial control value is set to one increment below the present value, as indicated by the numeral 31, this increment is divided by a preselected value, for example, 10, as indicated by the numeral 32, and microprocessor 158 proceeds to step 22 for the purpose of fine tuning YIG-tuned filter 112 for span.

As shown in FIG. 4B, microprocessor 158 then proceeds to find the center tune and span values for the next band (i.e., band 2), as indicated by the numeral 48, using the steps shown in FIGS. 4C and 4D. Thereafter, microprocessor 158 similarly finds the center tune and span values for any other band (i.e., bands 3 and 4), as indicated by the numeral 49, until all bands are tuned. Accordingly YIG-tuned filter 112 is calibrated over the entire frequency range of the measuring instrument, and any measurements taken thereafter are accurate.

Various embodiments of the calibration system and technique of this invention have been described by way of example. Modifications will be obvious to persons skilled in the art that are within the spirit of this invention. In order to appreciate the true scope of this invention, reference must therefore be made to the appended claims.

What is claimed is:

1. A calibrating system for a tuneable frequency band pass filter having a selectable center frequency comprising:
   electromagnetically resonant means having a variable resonance frequency;
   signal input means for receiving an electromagnetic signal;
   first coupling means connected to the signal input means for coupling the electromagnetic signal to the electromagnetically resonant means;
   an output;
   second coupling means connected to the output for coupling a signal from the electromagnetically resonant means to the output;
   measuring means, including a first local oscillator, connected to the output for producing a measurement signal having a predetermined relationship with the amplitude of the signal at the output;
   processing means connected to the measuring means and responsive to the measurement signal for producing control signals; and
   calibration means connected to the processing means comprising:
   (a) a sweep ramp generator for producing a span signal responsive to a first control signal;
   (b) means for producing a first tune signal responsive to a second control signal;
   (c) means responsive to the span signal and the first tune signal for driving the first local oscillator;
   (d) means for producing a second tune signal responsive to a third control signal; and
   (e) means connected to the electromagnetically resonant means and responsive to the span signal and the second tune signal for driving the electromagnetically resonant means.

2. The calibrating system as in claim 1 wherein the electromagnetically resonant means is yttrium-iron-garnet sphere and the first and second coupling means are oriented orthogonally.

3. The calibrating system as in claim 1 wherein the means included in the calibration means and responsive to the span signal and the first tune signal for driving the first local oscillator comprises:
   (a) a tune local oscillator circuit connected to the processing means for producing the first tune signal;
   (b) a first voltage divider connected to the processing means and the sweep ramp generator for producing a first variable span signal;
   (c) a first summer connected to the tune local oscillator circuit and the first voltage divider for producing a first tune + span signal; and
   (d) a first divider connected to the first summer and responsive to the first tune + span signal for producing the signal for driving the first local oscillator; and wherein the means included in the calibration means and responsive to the span signal and the second tune signal for driving the electromagnetically resonant means comprises:
   (a) a tune electromagnetically resonant means circuit connected to the processing means for producing the second tune signal;
   (b) a second voltage divider connected to the processing means and the sweep ramp generator for producing a second variable span signal;

(c) a second summer connected to the tune electromagnetically resonant means circuit and the second voltage divider for producing a second tune + span signal; and (d) a second divider connected to the second summer and responsive to the second tune + span signal for producing the signal for driving the electromagnetically resonant means.

4. The calibrating system as in claim 2 wherein the electromagnetic signal is produced by a comb generator.

5. In a calibration system for a tuneable frequency band pass filter having a selectable center frequency and also having a signal input, a signal output, and a tuning input, the improvement comprising:

means connected to the signal input for generating a reference signal;

measuring means, including a first local oscillator, connected to the signal output for producing a measurement signal having a predetermined relationship with the amplitude of a signal appearing at the signal output;

processing means connected to the measuring means and responsive to the measurement signal for producing control signals;

sweep ramp generating means connected to the processing means and responsive to a first control signal for generating a span signal;

first tune means connected to the processing means and responsive to a second control signal for producing a first tune signal;

the first local oscillator being driven by the span signal and the first tune signal; and second tune means connected to the processing means and responsive to a third control signal for producing a second tune signal at the tuning input of the tuneable frequency filter;

the tuneable frequency filter being driven by the span signal and the second tune signal.

6. A method for calibrating a tuneable frequency band pass filter having a selectable center frequency and also having a signal input, a signal output, and a tuning input comprising the steps of:

generating control signals;

generating a span signal in response to a first control signal;

generating a first tune signal in response to a second control signal;

inputting the sum of the span signal and the first tune signal as a drive signal to a first local oscillator;

generating a second tune signal in response to a third control signal;

inputting the sum of the span signal and the second tune signal to the tuning input of the tuneable frequency filter;

inputting a reference signal to the signal input of the tuneable frequency filter;

measuring the amplitude of an output signal at the signal output of the tuneable frequency filter; and varying the second tune signal in response to the third control signal until the measured amplitude is a predetermined value having a predetermined relationship with the center frequency of the tuneable frequency filter.

7. The calibrating method as in claim 6 wherein the step of varying the second tune signal comprises changing the second tune signal over a range to locate first and second 6 dB points, and further comprising the step of setting the center frequency of the tuneable frequency filter as the frequency equidistant between the 6 dB frequencies.

8. The calibrating method as in claim 6, further comprising the steps of setting the first and second tune signals at selected values having predetermined relationships with the center frequency, and varying the span signal over a preselected range for maximizing the response at frequencies within a pass band of the frequency tuneable filter at frequencies other than the center frequency.

9. The calibrating method as in claim 6 wherein the frequency tuneable filter is calibrated over each of a plurality of frequency bands.

10. The calibrating method as in claim 8 wherein the frequency tuneable filter is calibrated over each of a plurality of frequency bands.

11. The calibrating method as in claim 6 wherein the reference signal is a comb generator signal.

* * * * *

UNITED STATES PATENT AND TRADEMARK OFFICE
CERTIFICATE OF CORRECTION

PATENT NO. : 4,858,159

DATED : Aug. 15, 1989

INVENTOR(S) : Lynn M. WHeelwright, Vicky Ann Hansen, Mark D. Heerema

It is certified that error appears in the above-identified patent and that said Letters Patent is hereby corrected as shown below:

Line 5 of the Abstract, "YTF's s own" should read -- YTF's own --;

Column 6, Line 22, "microprocess or" should read -- microprocessor --;

Column 9, Line 49, "an inorement value" should read -- an increment value --.

Signed and Sealed this

Fourteenth Day of August, 1990

Attest:

HARRY F. MANBECK, JR.

Attesting Officer

Commissioner of Patents and Trademarks